United States Patent
Boesch et al.

(10) Patent No.: US 11,886,835 B2
(45) Date of Patent: Jan. 30, 2024

(54) CASCADE MULTIPLIER USING UNIT ELEMENT ANALOG MULTIPLIER-ACCUMULATOR

(71) Applicant: Redpine Signals, Inc., San Jose, CA (US)

(72) Inventors: Ryan Boesch, Louisville, CO (US); Martin Kraemer, Mountain View, CA (US); Wei Xiong, Mountain View, CA (US)

(73) Assignee: Ceremorphic, Inc., San Jose, CA (US)

(*) Notice: Subject to any disclaimer, the term of this patent is extended or adjusted under 35 U.S.C. 154(b) by 499 days.

(21) Appl. No.: 17/139,242

(22) Filed: Dec. 31, 2020

(65) Prior Publication Data

US 2022/0206753 A1 Jun. 30, 2022

(51) Int. Cl.
G06F 7/544 (2006.01)
H03M 1/12 (2006.01)

(52) U.S. Cl.
CPC .............. *G06F 7/5443* (2013.01); *H03M 1/12* (2013.01)

(58) Field of Classification Search
CPC ................................ G06F 7/5443; H03M 1/12
See application file for complete search history.

(56) References Cited

U.S. PATENT DOCUMENTS

| | | | |
|---|---|---|---|
| 2002/0093365 A1 | 7/2002 | Uno | |
| 2014/0035772 A1 | 2/2014 | Tsai et al. | |
| 2019/0042199 A1* | 2/2019 | Sumbul | G11C 7/12 |
| 2020/0125328 A1 | 4/2020 | Paulsen et al. | |
| 2021/0365241 A1* | 11/2021 | Huang | H03M 3/04 |

OTHER PUBLICATIONS

Search report for PCT/US2021/065190.

* cited by examiner

*Primary Examiner* — Michael D. Yaary
(74) *Attorney, Agent, or Firm* — File-EE-Patents.com; Jay A. Chesavage

(57) ABSTRACT

A multiplier-accumulator accepts A and B digital inputs and generates a dot product P by applying the bits of the A input and the bits of the B inputs to unit elements comprised of groups of AND gates coupled to charge transfer lines through a capacitor Cu. The number of bits in the B input is a number of AND-groups and the number of bits in A is the number of AND gates in an AND-group. Each unit element receives one bit of the B input applied to all of the AND gates of the unit element, and each unit element having the bits of A applied to each associated AND gate input of each unit element. The AND gates are coupled to charge transfer lines through a capacitor Cu, and the charge transfer lines couple to binary weighted charge summing capacitors which sum and scale the charges from the charge transfer lines, the charge coupled to an analog to digital converter which forms the dot product output. The charge transfer lines may span multiple unit elements.

20 Claims, 11 Drawing Sheets

Figure 1A

Multiplication of two three bit binary numbers $P = A*B = [a2\ a1\ a0] * [b2\ b1\ b0]$:

$$a0 * [0\ \ 0\ \ b2\ b1\ b0]$$
$$a1 * [0\ \ b2\ b1\ b0]$$
$$a2 * [b2\ b1\ b0]$$

Figure 1B $$P = [\underbrace{0}_{p5}\ \ \underbrace{a2b2}_{p4}\ \ \underbrace{a1b2+a2b1}_{p3}\ \ \underbrace{a0b2+a1b1+a2b0}_{p2}\ \ \underbrace{a0b1+a1b0}_{p1}\ \ \underbrace{a0b0}_{p0}]$$

$$P = 2^5 * p5 + 2^4 * p4 + 2^3 * p3 + 2^2 * p2 + 2^1 * p1 + 2^0 * p0$$

Unit Element with gain balancing caps

Figure 2B Unit Element with Summing unit gain balancing

Multiplication of two 4 bit binary numbers

[a3 a2 a1 a0] * [b3 b2 b1 b0]:

a0 * [0  0  0  b3 b2 b1 b0]

a1 * [0  0  b3 b2 b1 b0]

a2 * [0  b3 b2 b1 b0]

a3 * [b3 b2 b1 b0]

$$P = [\underline{0}_{p7}\ \underline{a3b3}_{p6}\ \underline{a2b3+a3b2}_{p5}\ \underline{a1b3+a2b2+a3b1}_{p4}$$

$$\underline{a0b3+a1b2+a2b1+a3b0}_{p3}\ \underline{a0b2+a1b1+a2b0}_{p2}\ \underline{a0b1+a1b0}_{p1}\ \underline{a0b0}_{p0}]$$

$$P = 2^7*p7 + 2^6*p6 + 2^5*p5 + 2^4*p4 + 2^3*p3 + 2^2*p2 + 2^1*p1 + 2^0*p0$$

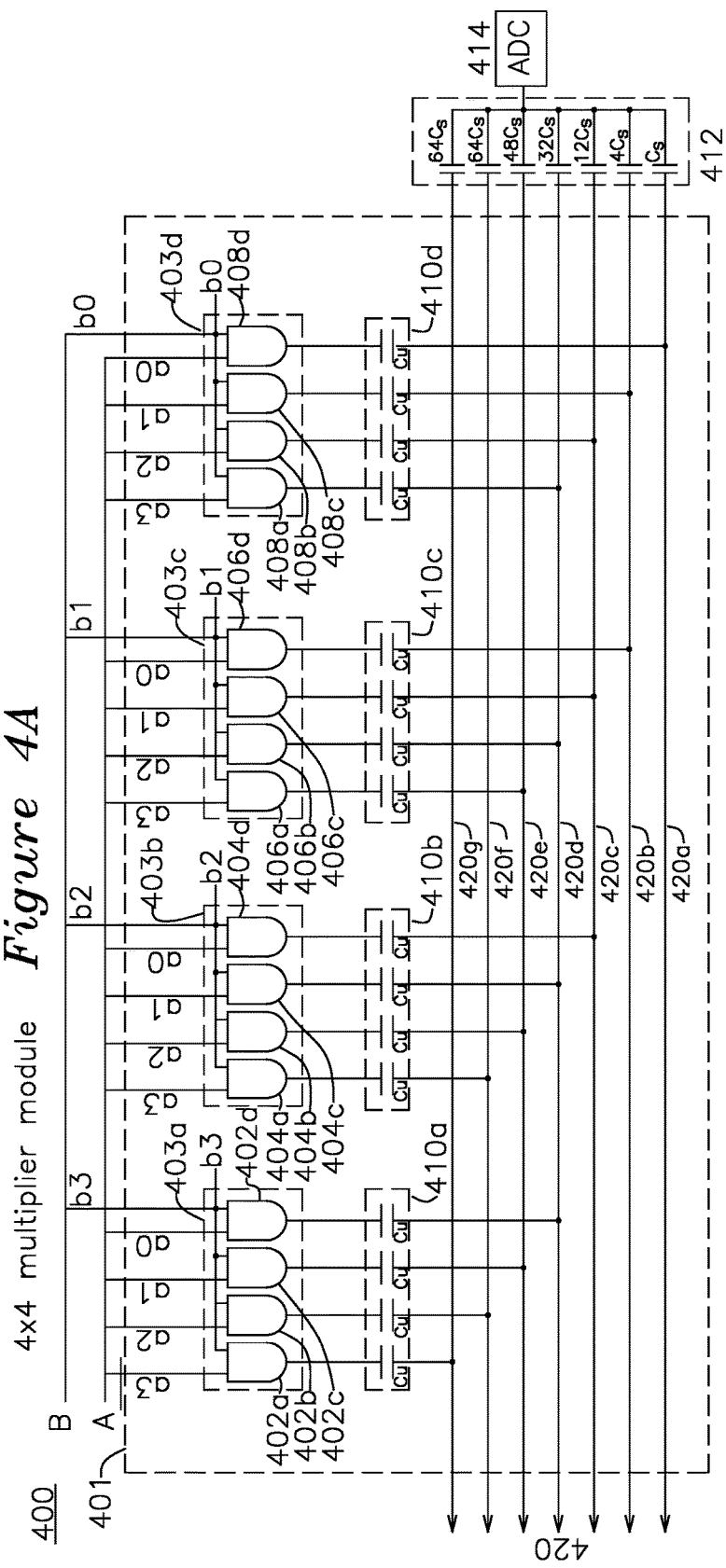
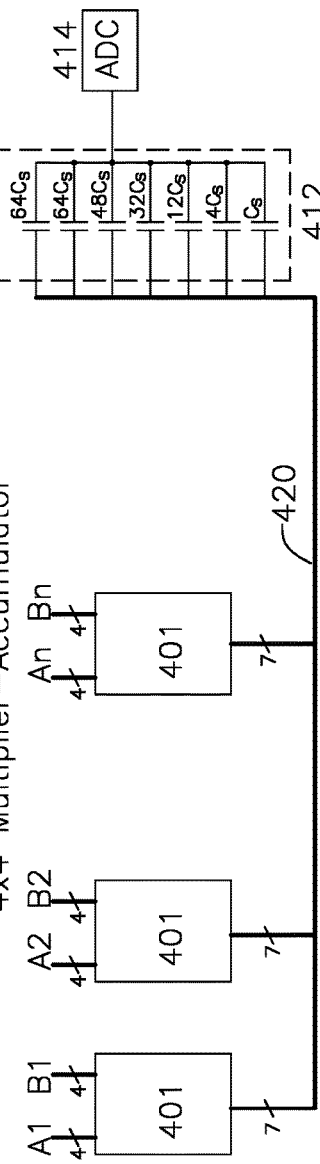

Multiplication of two 8 bit binary numbers $$P = [\underbrace{a7..a4}_{A1} \underbrace{a3..a0}_{A0}] * [\underbrace{b7..b4}_{B1} \underbrace{b3..b0}_{B0}] =$$

$$P = A1*B1*2^8 + (A0*B1 + A1*B0)*2^4 + A0*B0*2^0$$

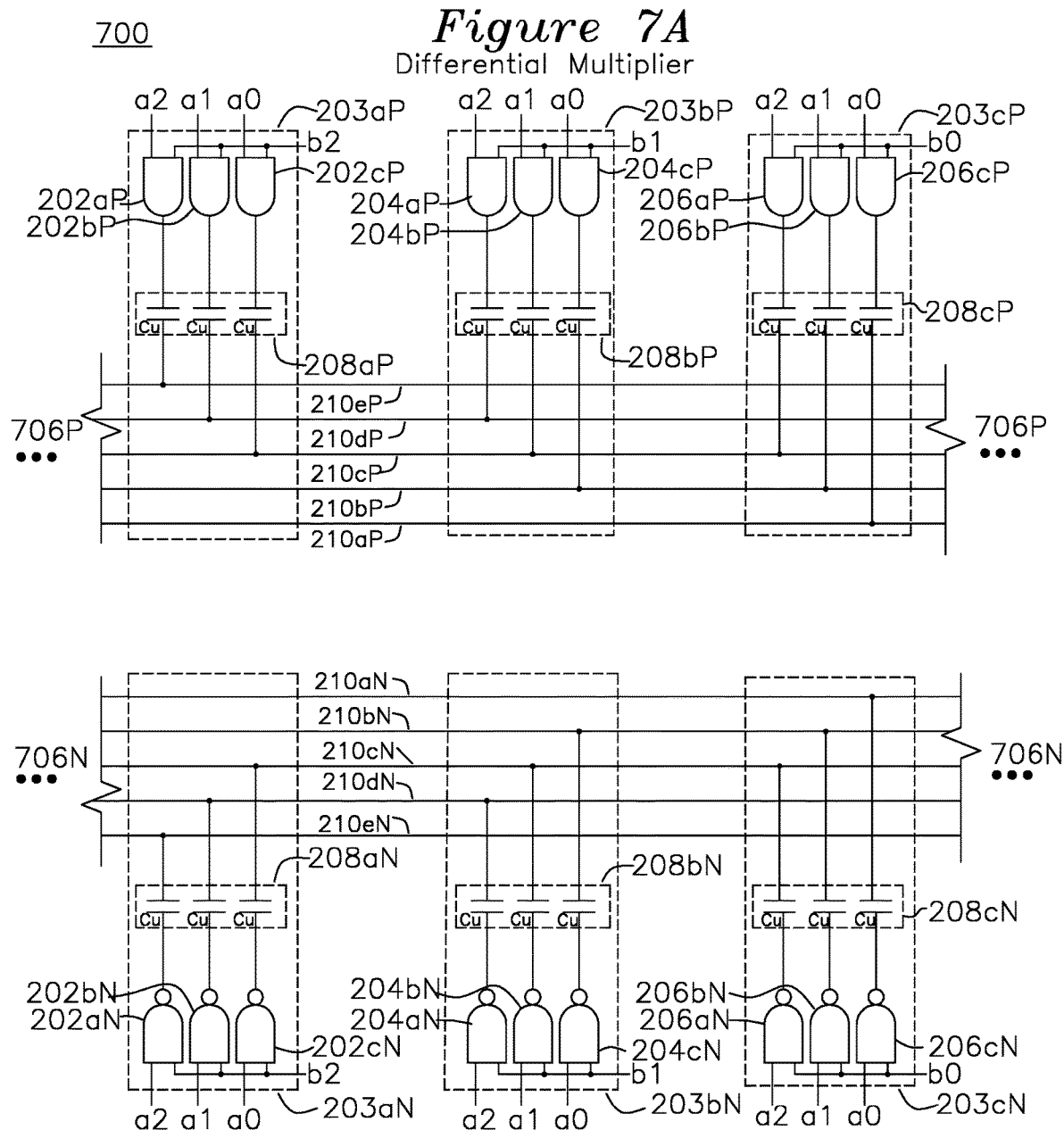

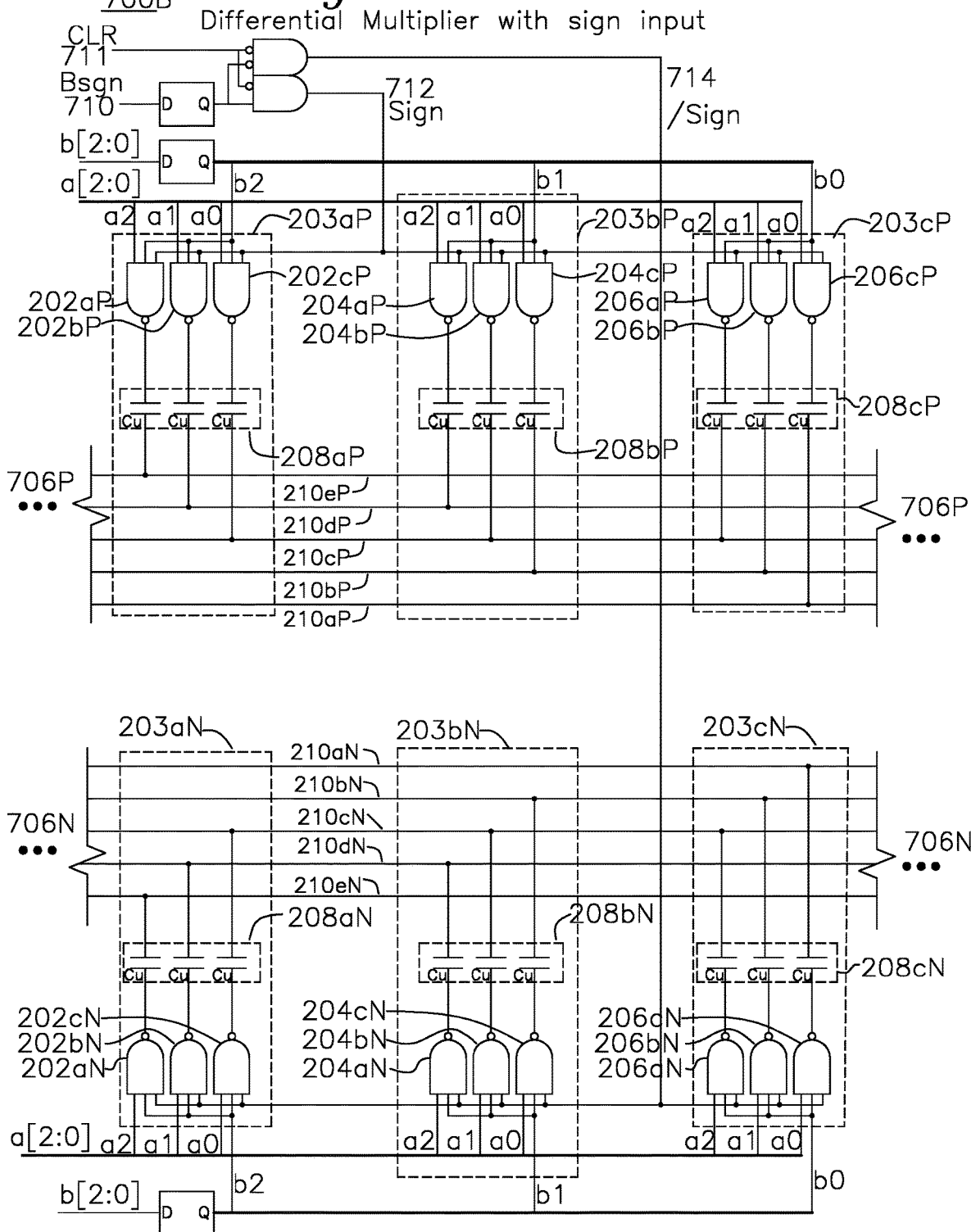

Differential UE binary weighting and ADC

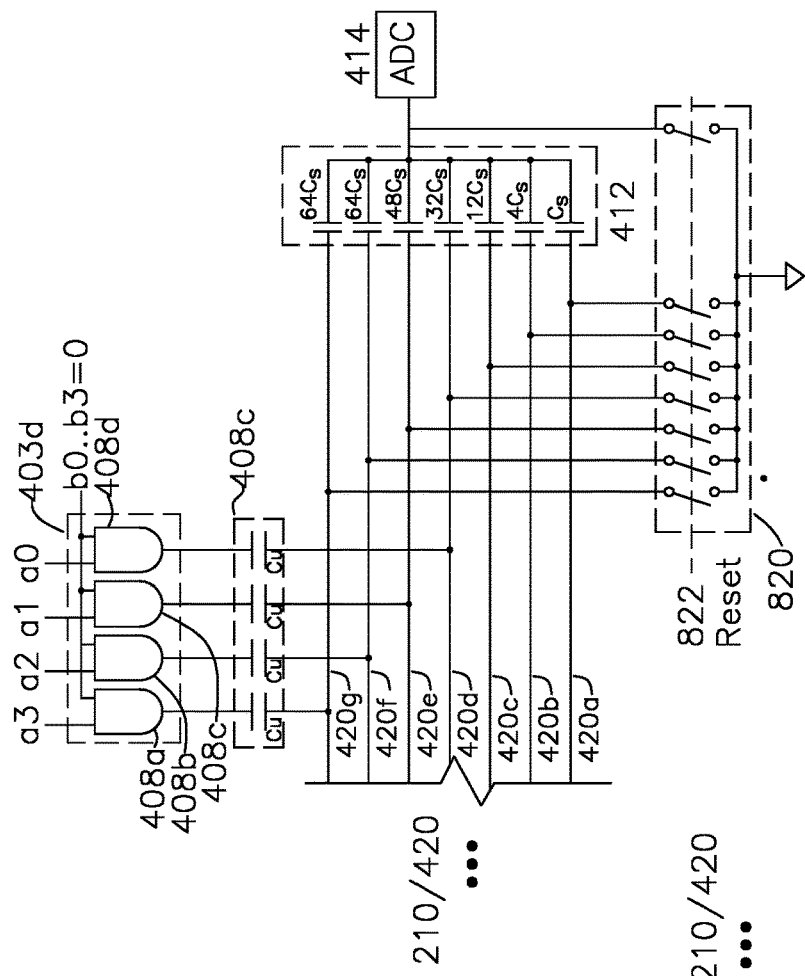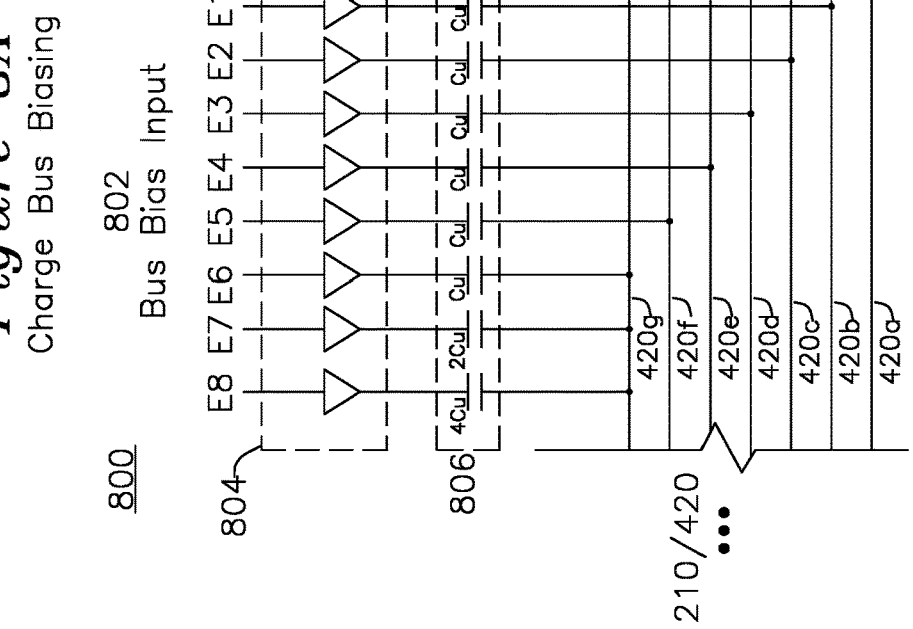

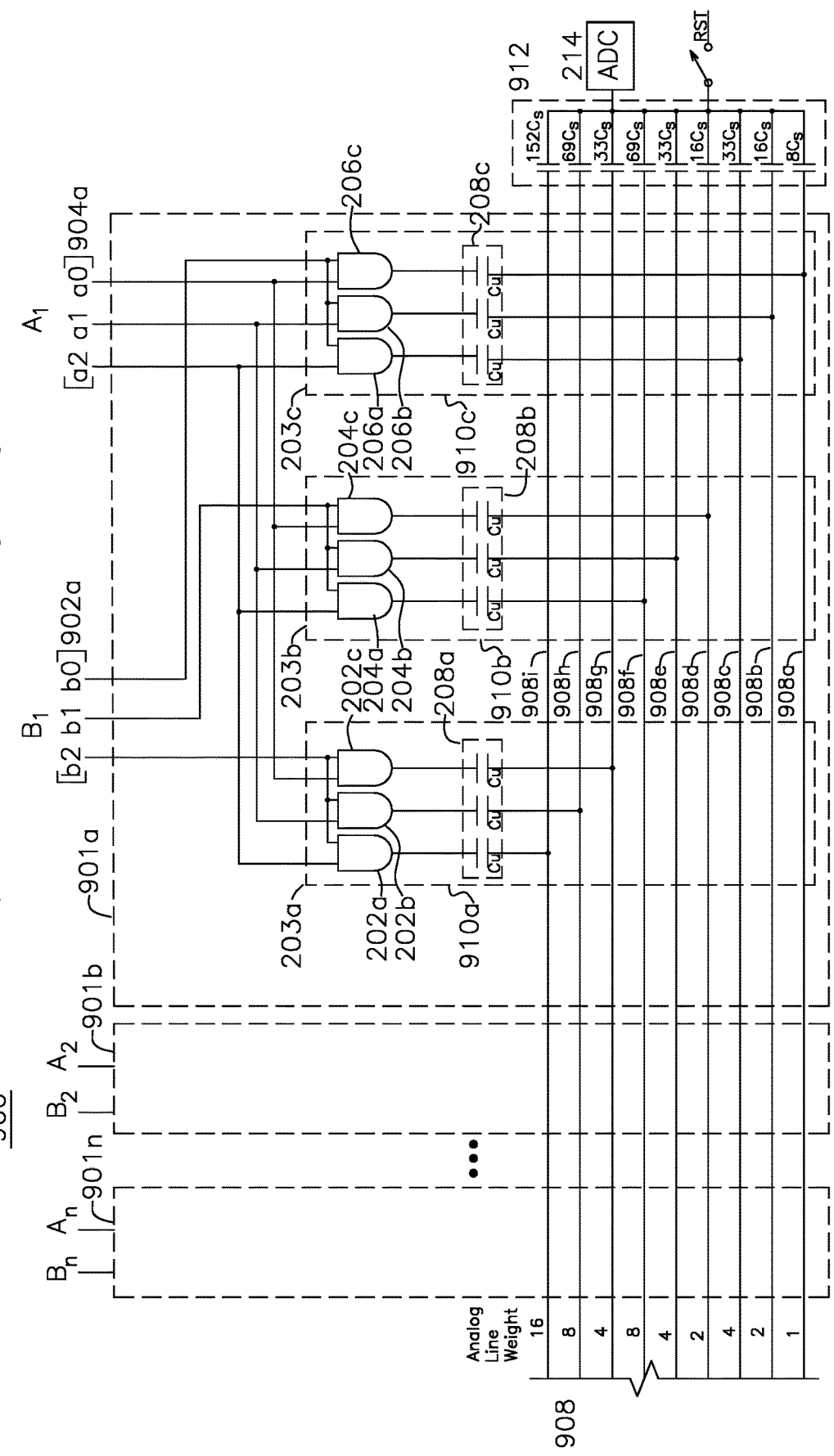

CASCADE MULTIPLIER USING UNIT ELEMENT ANALOG MULTIPLIER-ACCUMULATOR

FIELD OF THE INVENTION

The present invention relates to a multiplier-accumulator. In particular, the invention relates to an asynchronous multiplier operable to be cascaded and configured to operate as a multiplier-accumulator, which accepts digital inputs and generates a summed analog output which can be digitized to form a digital output representing a sum of multiplication products.

BACKGROUND OF THE INVENTION

The expanded use of Artificial Intelligence (AI) software applications has created a need for scalable hardware multiplier-accumulators for acceleration of software algorithms used in machine learning (ML). An n×n multiplier increases in gate complexity as $n^2$, and large numbers of adders are further needed for multiply-accumulate operations. Additionally, prior art multipliers relied on synchronous, clocked stages to operate, and the clocked operation results in increased power dissipation.

For example, in machine learning applications, it is often desired to form dot products in the form of multiply-accumulate operations between a 1×n input row vector A and a n×m B coefficient matrix to generate a 1×m result R, such as:

$$[A_1\ A_2\ \ldots\ A_n] \cdot \begin{bmatrix} B_{11} & \ldots & B_{1m} \\ \vdots & \ddots & \vdots \\ B_{n1} & \ldots & B_{nm} \end{bmatrix} =$$

$$\begin{bmatrix} R_1 \\ \vdots \\ R_n \end{bmatrix}^T = \begin{bmatrix} A_1B_{11} + A_2B_{21} + \ldots + A_nB_{n1} \\ A_1B_{12} + AB_{22} + \ldots + A_nB_{n2} \\ \vdots \\ A_1B_{1m} + A_2B_{2m} + \ldots + A_nB_{nm} \end{bmatrix}^T$$

It is desired to provide a new low-power architecture for a multiplier and multiplier-accumulator which operates asynchronously and minimizes displacement currents internal to the unit element multiplier by arrangement of internal circuits, specifically through the use of an architecture which minimizes internal state changes when B is a static weighting matrix, as is commonly used in ML calculations, thereby reducing power consumption per calculation. It is further desired to provide a simplified architecture for a cascaded analog multiplier-accumulator to form a product as an analog quantity which is converted to a digital form for subsequent processing.

OBJECTS OF THE INVENTION

A first object of the invention is a unit element accepting a digital A input and a digital B input, the unit element performing a single multiply operation and adding a corresponding charge to an analog charge bus, the unit element comprising an AND-group comprising a plurality of AND gates, each AND gate of an AND-group having one input coupled to a unique one of the A input bits and the other AND gate inputs commonly coupled to one of the B input bits, the output of each AND gate representing a product term and having a bit order equal to the sum of the A input bit position and B input bit position, each AND gate output coupled to an analog charge line associated with the bit order through a charge transfer capacitor of value Cu, each analog charge line common to other unit elements, each analog charge line coupled to a charge summing unit comprising charge summing capacitors which provide a charge transfer for each analog charge line of two to the power of the bit order, the charge summing unit having a first terminal of a respective charge summing capacitor coupled to a respective analog charge line according to the bit weight of the analog charge line, the charge summing capacitors having a second terminal which are coupled together and also coupled to the input of an analog to digital converter (ADC) which provides the product of A and B for all unit elements at the output of the ADC output.

A second object of the invention is a multiplier-accumulator comprising a plurality of unit elements, each unit element accepting a digital A input and a digital B input, each unit element comprising a plurality of AND-groups, each AND-group comprising a plurality of AND gates, each AND gate having one input coupled to a unique one of the A input bits and the other AND gate input commonly coupled to one of the B input bits, the output of each AND gate of each AND-group having an associated bit order according to a sum of bit position of the associated A input bit and B input bit, each AND gate output coupled through a capacitor of value Cu to a particular analog charge line of an analog charge bus according to bit order, the plurality of unit elements sharing respective analog charge lines of the analog charge bus, the analog charge bus coupled to a charge summing unit comprising a plurality of charge summing capacitors which transfer charge according to two to the power of bit order, each analog charge line coupled to a first terminal of a respective charge summing capacitor transferring charge according to two to the power of bit order, the charge summing capacitors having a second terminal which is coupled together and coupled to an analog to digital converter (ADC), the ADC thereby outputting a digital value representing the sum of products from the plurality of unit elements.

A third object of the invention is a multiplier for n input bits on at least one multiplicand, where the n input bits of the at least one multiplicand are subdivided into at least one plurality of m bits, each of the plurality of m bits coupled to a sub-product multiplier generating a digital sub-product value, each sub-product multiplier input coupled to a plurality of unit elements, each unit element accepting a digital A input of m bits and a digital B input of m bits, each sub-product multiplier comprising a plurality of AND-groups, each AND-group comprising a plurality of AND gates, each AND gate having one input coupled to a unique one of the A input bits and the other AND gate inputs commonly coupled to one of the B input bits, the output of each AND gate of each AND-group associated with a bit order according to the sum of an A input bit position and B input bit position, each AND gate coupled to a particular analog charge line through a charge transfer capacitor of value Cu, the unit element charge lines coupled to a charge summing unit having a charge summing capacitor for each analog charge line, each analog charge line coupled to a first terminal of a respective summing capacitor transferring charge from a respective analog charge line in an amount proportional to two to the power of the bit order, each summing capacitor having a second terminal which is coupled to the second terminal of other charge summing capacitors and also coupled to an analog to digital converter generating a digital value as the output of the sub-product multiplier, each of the sub-product multiplier digital outputs shifted by a number of bits representative of the magnitude of the sub-product multiplier output, and where the shifted sub-product multiplier outputs are summed together to form a multiplier output.

A fourth object of the invention is a plurality of unit elements, each unit element multiplying a unique A digital input and a B digital input, the A digital input and B digital input and transferring charge values according to a multiplication result, the multiplication result provided as a plurality of charges transferred to respective analog charge lines of a shared analog charge bus, each unit element of the plurality of unit elements contributing a transferred charge to a respective analog charge line according to a bit order determined by a sum of a bit position of each A digital input bit and each B digital input bit, the shared analog charge bus coupled to a charge summing unit comprising a plurality of summing capacitors, each summing capacitor having a value which transfers charge according to two to the power of the bit order, each summing capacitor having a first terminal connected to one of the analog charge lines, the other terminal of the binary weighted capacitors coupled together and to an analog to digital converter for providing an accumulated multiplication result of the A and B digital inputs.

A fifth object of the invention is a differential unit element (UE) for multiplying an A digital value and a B digital value and transferring the result to an analog charge bus, the differential unit element having a positive unit element part and a negative unit element part;
 the positive unit element part comprising a plurality of AND-groups, each AND-group having a plurality of AND gates having one input coupled to a unique one of the A bits and an input coupled to one of the B bits, each AND gate coupled to a positive analog charge line according to a bit order determined by a sum of the bit position of a corresponding A bit and the bit position of a corresponding B bit;
 the negative unit element part also comprising a plurality of AND-groups, each AND-group having a plurality of AND gates having one input coupled to a unique one of the A bits and an input coupled to one of the B bits, each AND gate coupled a negative analog charge line according to a bit order determined by a sum of the bit position of a corresponding A bit and a bit position of the corresponding B bit;
 the positive charge lines and negative charge lines being coupled to a positive charge summing unit and a negative charge summing unit, each positive charge summing unit and negative charge summing unit comprising a plurality of charge summing capacitors, each charge summing capacitor having a value which transfers charge according to a binary weight of the respective bit order of each associated charge line, each summing capacitor having a first terminal connected to a respective positive charge line or negative charge line, the positive charge summing unit and negative charge summing unit having a respective positive output terminal and a respective negative output terminal connected respectively to an analog to digital converter (ADC) positive input and negative input, the ADC having an output providing a digital output value, the positive analog charge bus and negative analog charge bus optionally coupled to other unit elements.

A sixth object of the invention is a differential unit element (UE) for multiplying an A digital value and a signed B digital value and transferring the result to analog charge lines of an analog charge bus, the differential unit element having a positive unit element part and a negative unit element part;
 the positive unit element part enabled when the B sign is positive and comprising a plurality of AND-groups, each AND-group having a plurality of AND gates having one input coupled to a unique one of the A bits and an input coupled to one of the B bits, each AND gate coupled through a capacitor having a value Cu to a positive analog charge line, each AND gate having a bit order according to the sum of an associated A input bit and B input bit;
 the negative unit element part enabled when the B sign is negative, the negative unit element part comprising a plurality of AND-groups, each AND-group having a plurality of AND gates having one input coupled to a unique one of the A bits and an input coupled to one of the B bits, each AND gate coupled through a capacitor having a value Cu to a negative analog charge line, each AND gate having a bit order according to the sum of an associated A input bit and B input bit;
 the positive charge lines and negative charge lines being coupled to a positive charge summing unit and a negative charge summing unit, respectively, each positive charge summing unit and negative charge summing unit comprising a plurality of summing capacitors, each summing capacitor transferring a charge equal to two to the power of the order of a respective charge line, each summing capacitor having a first terminal connected to a respective positive charge line or negative charge line, the positive charge summing unit and negative charge summing unit having a respective positive output terminal and a respective negative output terminal connected respectively to an analog to digital positive input and negative input, the ADC having an output providing a digital output value, the positive analog charge bus and negative analog charge bus optionally coupled to other unit elements.

SUMMARY OF THE INVENTION

In a first example of the invention, a unit element for multiplication of two binary multiplicands A and B, each having m bits, comprises a plurality of AND-groups, each AND-group comprising a plurality m of AND gates, each AND gate of an AND-group receiving individual bits of A and a unique one of the bits of B. The output of each AND gate of each unit cell is coupled to a respective charge transfer capacitor with value Cu to an analog charge line arranged according to a bit order determined by a sum of the A input bit number and B input bit number coupled to the respective AND gate. The analog charge lines form an analog charge bus which is coupled to a charge summing unit which performs a charge transfer according to a respective bit order of an associated analog charge line. Each of the analog charge lines is coupled to a first terminal of a charge summing capacitor, each charge summing capacitors transferring a charge proportional to two to the power of the bit order of the associated analog charge line, the charge summing capacitors having a second terminal which are connected together and connected to the input of analog to digital converter which provides the multiplication product as a digital value.

In a second example of the invention providing an accumulating multiplier, a plurality of the unit elements of the first example of the invention are coupled to a common set of analog charge lines, the analog charge lines coupled to charge summing capacitors and to the analog to digital converter to generate an accumulated multiplication result for the plurality of unit elements.

In a third example of the invention, the invention provides for a multiplier for n bits of each multiplicand, the n bits subdivided into multiple pluralities, the subdivided bits provided to separate multipliers to generate sub-results which are shifted and summed together to form a product output.

In a fourth example of the invention, a differential unit element has a positive unit element part and a negative unit element part;

the positive unit element part comprising a plurality of AND-groups, each AND-group comprising a plurality of AND gates performing bit-wise multiplications having a respective bit order, each positive unit element part AND gate output coupled through a charge transfer capacitor to a positive charge transfer line on a charge transfer line according to a binary weight of its bit order, the positive charge transfer lines coupled to a positive charge summing unit, the charge summing unit comprising charge summing capacitors, each charge summing capacitor having a first terminal connected to a respective positive charge transfer line and transferring a charge proportional to the charge transfer line binary weight, the capacitors of the positive charge summing unit having a second terminal connected together and to a positive input of an analog to digital converter (ADC);

the negative unit element part comprising a plurality of AND-groups, each AND-group comprising a plurality of AND gates performing bit-wise multiplications having a respective bit order, each negative unit element part AND gate output coupled through a charge transfer capacitor to a negative charge transfer line on a charge transfer line according to a binary weight of its bit order, the negative charge transfer bus lines coupled to a negative charge summing unit, the negative charge summing unit comprising charge summing capacitors, each charge summing capacitor having a first terminal connected to a respective negative charge transfer line and transferring a charge proportional to the charge transfer line binary weight, the capacitors of the negative charge summing unit having a second terminal connected together and to a negative input of an analog to digital converter (ADC), the ADC generating a product output value. In one example of the invention, a plurality of unit elements share a common positive analog charge bus and a common negative analog charge bus.

BRIEF DESCRIPTION OF THE DRAWINGS

FIG. 1A shows an example multiplication of two 3 bit multiplicands.

FIG. 1B shows an expansion of the multiplication of FIG. 1A identifying individual terms.

FIG. 2B shows a schematic diagram of the unit element of FIG. 2A with analog bus gain balancing capacitors incorporated into the charge summing capacitors.

FIG. 4A shows a schematic diagram for a 4×4 unit element coupled to binary weighted charge summing capacitors which incorporate gain balancing.

FIG. 4B shows a block diagram for an example 4×4 multiplier-accumulator for use with FIG. 4A.

FIG. 7A shows a schematic diagram for a differential unit element.

FIG. 7B shows a schematic diagram for a differential unit element with a signed multiplicand and gain balancing.

FIG. 8A shows a schematic diagram for an analog charge bus biasing.

FIG. 8B shows a schematic diagram for performing a charge state reset.

FIG. 9 shows a unit element with individual charge transfer lines coupled to a charge summing unit incorporating gain balancing capacitance.

DETAILED DESCRIPTION OF THE INVENTION

Figure 1C:
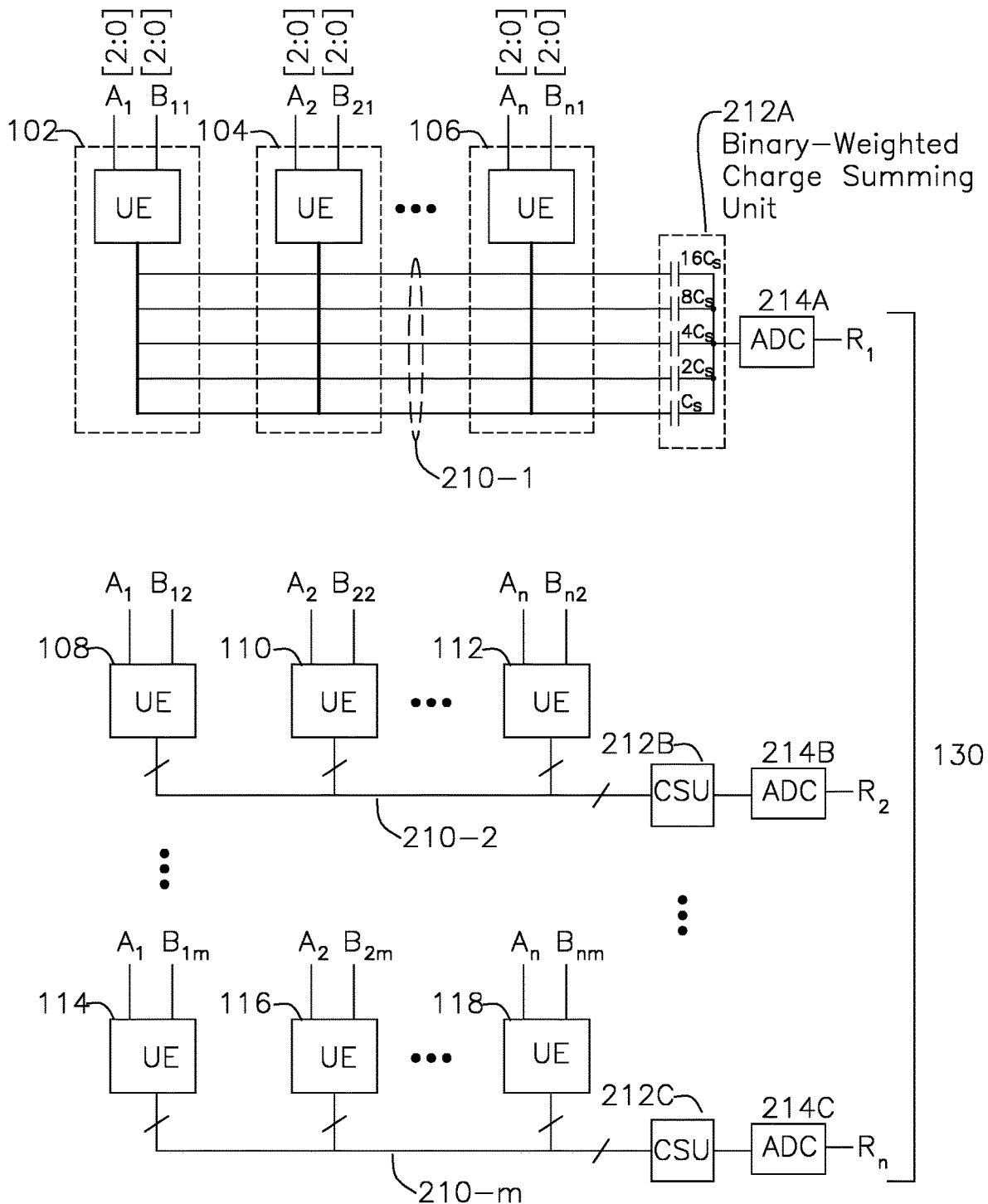
FIG. 1C shows a block diagram for an accumulating multiplier performing dot product operations.

By way of convention, in the present application, similar reference numbers on different figures indicate the same element or function. Where a function is performed by individual elements, the suffix a, b, c etc may be appended as appears in the drawings, whereas the elements taken as a whole are understood to be without suffix, so for example unit element 201 or analog charge bus 210 are understood to refer to the entire structure when a suffix a, b, c, etc are not present.

FIGS. 1A and 1B show an example expansion for multiplication of two 3 bit binary numbers. This may also be described as the partial product expansion:

$p0[2:0]=\{a[0]\&b[2],a[0]\&b[1],a[0]\&b[0]\}$ $p1[2:0]=\{a[1]\&b[2],a[1]\&b[1],a[1]\&b[0]\}$ $p2[2:0]=\{a[2]\&b[2],a[2]\&b[1],a[2]\&b[0]\}$ which can be rearranged as:

$P=1*p0[0]+2*(p0[1]+p1[0])+4*(p0[2]+p1[1]+p2[0])+8*(p1[2]+p2[1])+16*(p2[2])$

In one example embodiment, the binary charge summing may be performed by selection of relative capacitor values in the charge summing unit. If each product term has its own individual capacitors, this would result in (1+2+2+4+4+4+8+8+16)=49 individual capacitors.

FIG. 1C shows a block diagram example dot product for implementing the dot product:

$$[A_1 \; A_2 \; \ldots \; A_n] \cdot \begin{bmatrix} B_{11} & \ldots & B_{1m} \\ \vdots & \ddots & \vdots \\ B_{n1} & \ldots & B_{nm} \end{bmatrix} =$$

$$\begin{bmatrix} R_1 \\ \vdots \\ R_n \end{bmatrix}^T = \begin{bmatrix} A_1 B_{11} + A_2 B_{21} + \ldots + A_n B_{n1} \\ A_1 B_{12} + A B_{22} + \ldots + A_n B_{n2} \\ \vdots \\ A_1 B_{1m} + A_2 B_{2m} + \ldots + A_n B_{nm} \end{bmatrix}^T$$

Unit Elements (UE) 102, 104, . . . , 106 perform the computation for element R1 of the dot product, UE 108, 110, . . . , 112 perform the computation for element R2 of the dot product, and UE 114, 116, . . . , 118 perform the computation for element Rn. Accordingly, the architecture of the present invention provides for any number of UEs to be arranged in rows and columns as shown to provide an expandable dot matrix computation for an arbitrary size of the A and B matrices. Additionally, the architecture provides flexibility in being reconfigured for a larger or smaller number of A and B matrices.

Figure 2A:
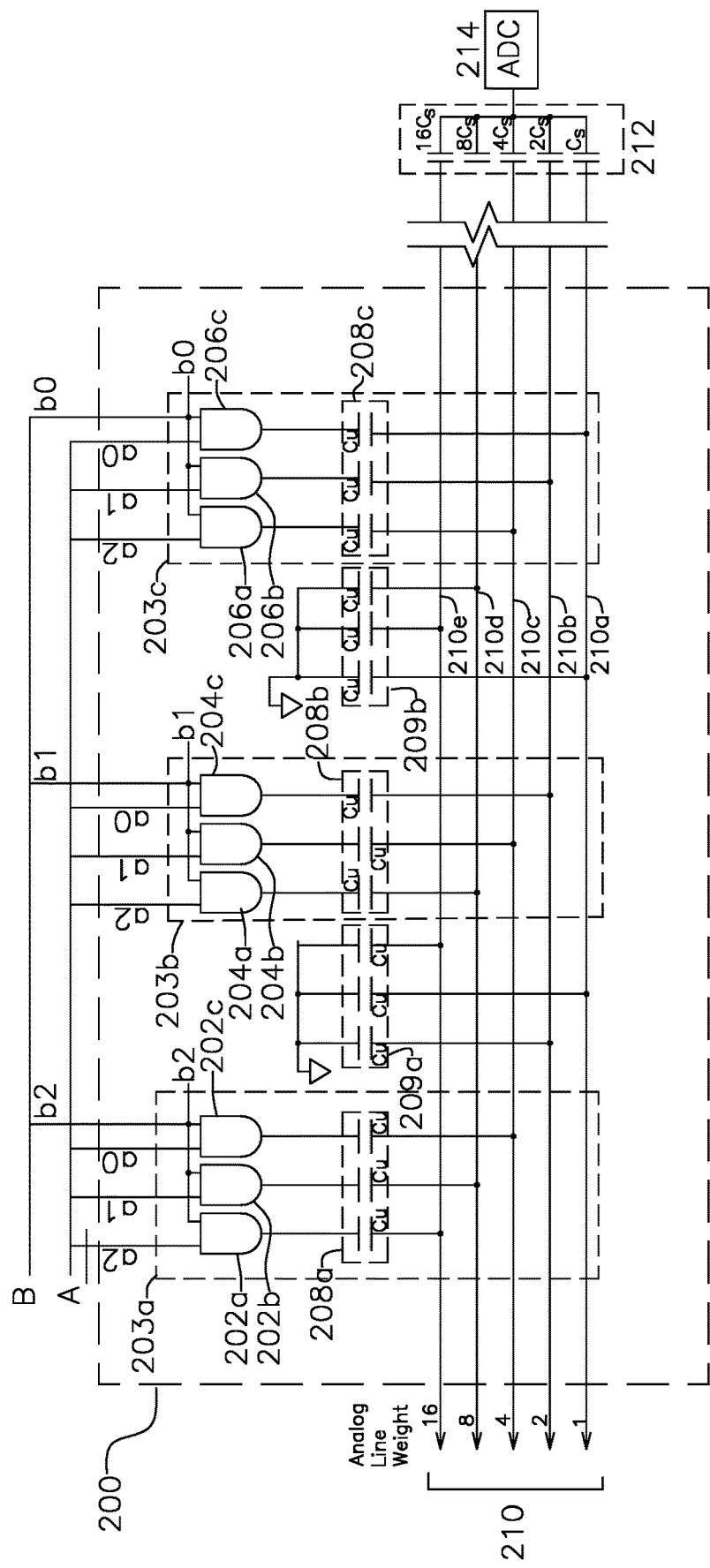
FIG. 2A shows a schematic diagram of a unit element with analog charge bus gain balancing capacitors.

FIG. 2A shows a schematic diagram of a unit element 200 comprising a plurality of AND-groups 203a, 203b, and 203c, where each AND-group such as 203a comprises AND gates 202a, 202b, and 202c and charge transfer capacitors 208a coupling each AND gate output to an analog charge line according to bit order of the multiplication, as described by the $2^n$ terms of FIG. 1B. Each of the multiplicand bits for A is applied to the inputs of AND gates 202a, 202b, 202c; 204a, 204b, 204c; and 206a, 206b, 206c for each respective AND-groups 203a, 203b, and 203c. Each of the multiplicand bits for B is separately input as a term for each of the AND gates 202a, 202b, 202c; 204a, 204b, 204c; and 206a, 205b, 206c, of the respective AND-groups 203a, 203b, and 203c, as shown. The output of each AND gates of AND-groups 203a, 203b, 203c is provided through respective charge transfer capacitors 208a, 208b, and 208c with capacitance value Cu to the analog charge bus 210 which comprises analog charge transfer lines 210a, 210b, 210c, 210d, and 210e, which are ordered by corresponding binary weighted charge conferred, with a most significant bit (MSB) transferring greater charge than a least significant bit (LSB), each charge transfer line having a power of 2 greater charge transfer than a lower significant charge transfer line. Additionally, each of the analog charge transfer lines has gain balancing capacitors 209a and 209b such that the capacitance associated with the number of AND gate charge transfer capacitors connected to a particular charge line of the analog charge bus 210 is equalized, such that each charge transfer line 210a, 210b, 210c, 210d, and 210e have a total capacitance equal to the AND gate charge transfer capacitance of other charge transfer lines. The binary weighted charge summing capacitors in charge summing unit 212 each have individual capacitance values which increase by powers of two as $Cs=2^m$, where m is the magnitude order, and each charge summing capacitor Cs of charge summing unit 212 has a value which is much smaller than the aggregate capacitance value of the individual charge transfer capacitors Cu coupled to each associated analog charge line such as 210a. It is preferred that the aggregate capacitance of Cu on each analog charge line exceed Cs by a factor of 8 or more, to avoid systematic errors. As was observed for analog charge buses 210-1, 210-2, and 210-m of FIG. 1C, the analog charge lines are connected to many UE, which makes the requirement of the Cs to be smaller in value than the total number of charge transfer capacitors Cu from the many UEs on a charge transfer line of 210-1, 210-2, etc attached to the analog charge lines easier to meet. One terminal of each charge summing capacitor of charge summing unit 212 is coupled to an associated analog charge line 210a through 210e, and the other terminal of the charge summing capacitors of charge summing unit 212 are coupled together and coupled to the input of an analog to digital converter 214 for conversion to a digital output value P representing the product of A and B. In one example of the invention, Gain balancing capacitors, also referred to as "dummy capacitors" 209a, and 209b are added to equalize the loading of capacitance on each analog charge line of bus 210, in this example, to equalize to a total of 3 C per charge transfer line per unit element connected to each charge transfer line. In this example of the invention, the charge summing capacitors have a value Cs*(sum of charge transfer capacitors coupled to the charge transfer line)*$2^{bit\_order}$, where bit_order is the sum of the bit positions of the multiplicand input bits. For example, the bit order of AND gate 206c multiplying b0 and a0 is 0+0=0, with binary weight $2^0=1$. The bit order of AND gate 202a multiplying a2 and b2 is 2+2=4, with binary weight $2^4=16$. In these and other examples, each AND gate is coupled through a charge transfer capacitor to a respective charge transfer line with a bit order and binary weight (two to the power of the respective bit_order). As will be seen, the binary weight provides a comparative power of two transfer of charge contributed by each AND gate output compared to other AND gate outputs, although the charge balancing capacitors and values of individual charge summing capacitors take different values depending on how gain balancing is performed—either using gain balancing capacitors 209a and 209b to equalize charge, or by incorporating the gain balancing capacitors into the charge summing capacitors.

The term "gain balancing capacitor" is understood to describe capacitors such as 209a and 209b that are added to individual analog charge lines 210 to equalize the capacitance of each analog charge line so that the charge transferred from each Cu 208a and 208b has equal effect. However, each analog charge line has an associated binary weight which depends on a bit weight of the multiplication result coupled to each particular analog charge line, and the capacitance of each particular summing capacitor for each associated analog charge line provides that bit weight in the amount of charge transferred to the output of the summing unit for each line according to bit weight of the charge transfer line. The summing unit 212 thereby has capacitors with values on each charge transfer line which provide the required binary analog line weight as shown in FIG. 2A.

FIG. 2B shows the unit element 200 of FIG. 2A with gain balancing capacitors incorporated in charge summing unit 212. In this example, the gain balancing capacitors 209a and 209b of FIG. 2A are transferred to the values of the charge summing capacitors of 212 associated with each analog charge line of analog charge bus 210. Each charge summing capacitor of 212 has a respective value for each nth charge transfer line Cs=num_charge_transfer_caps*$2^n$, where num_charge_transfer_caps is the number of charge transfer caps on analog charge line n. As with FIG. 2A, each analog charge line is operative to transfer a charge according to a binary weight based on the bit order of the analog charge line, which determines the size of each summing capacitor coupled to each analog charge line.

Figures 3A, 3B:
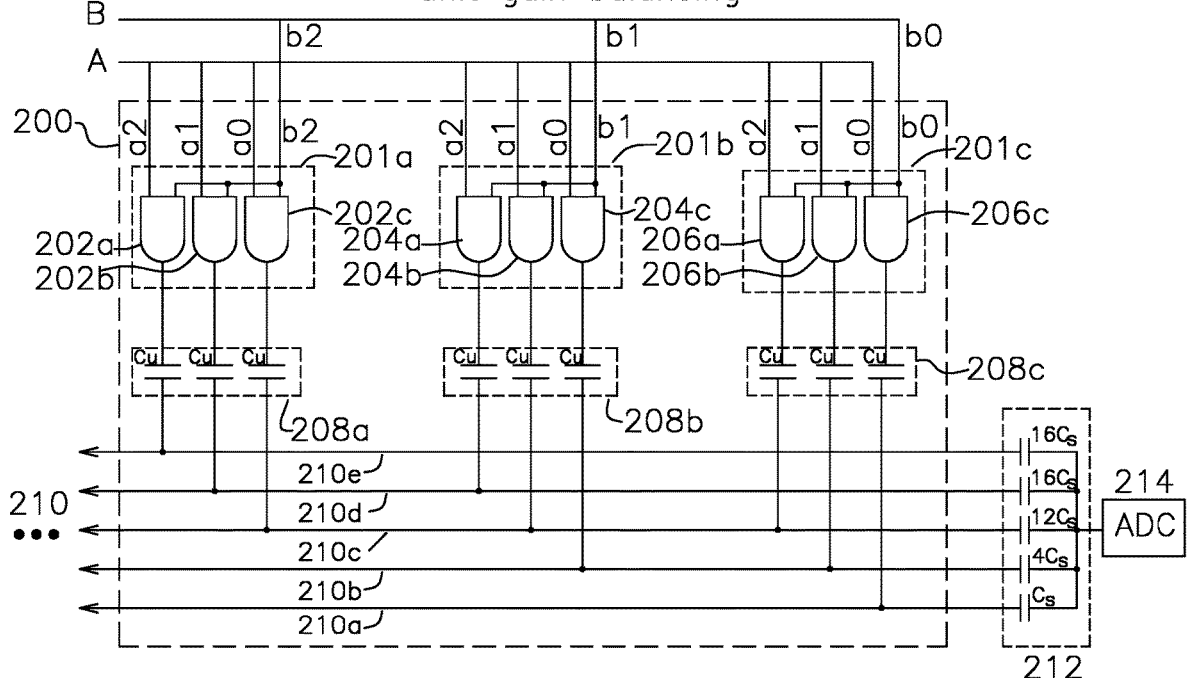
FIG. 3A shows the multiplication of two 4 bit binary numbers.
FIG. 3B shows an expansion of the multiplication of FIG. 3A.

FIGS. 3A and 3B are similar to FIGS. 2A and 2B, respectively, showing the individual bits and organization into associated terms for multiplication of two 4 bit binary numbers rather than the 3 bit examples of FIGS. 2A and 2B.

FIG. 4A shows an example 4×4 unit element 401, which has an expanded architecture for four bits similar to the three bit example of FIG. 2B, and includes the gain balancing capacitors incorporated into charge summing capacitors Cs of binary weighted charge summing unit 412.

A key advantage of the present architecture is the ability to scale to larger and larger multiply-accumulation operations by addition of UEs, and FIG. 4B shows an example using several unit element 401 of FIG. 4A to form the multiply/accumulate product P=(A1*B1+A2*B2+ . . . +An*Bn). In some examples of the invention for AI purposes, an input-independent bias term Bias=(En . . . E0) may be applied, such as P=(A1*B1+A2*B2+ . . . +An*Bn+Bias).

Figures 5, 6:
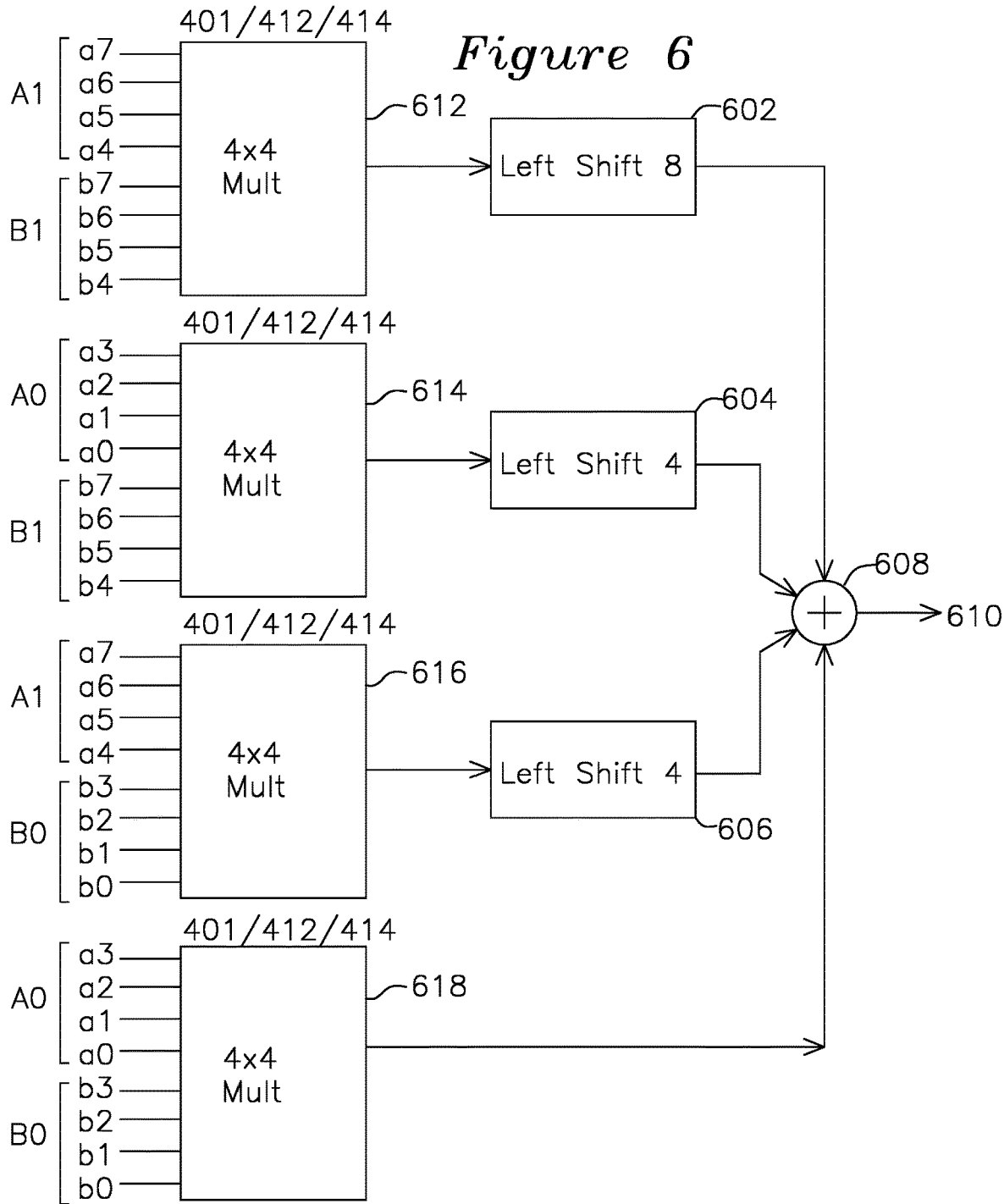
FIG. 5 shows an example expansion for multiplication of two 8 bit binary numbers.
FIG. 6 shows an example block diagram for an 8×8 multiplier.

One difficulty of the present invention is that the terms expansion requires larger and larger numbers of AND gates. For example, multiplication of an 8×8 by continued expansion of the architecture of FIG. 4A would require 64 AND gates. FIGS. 5 and 6 show an expansion of the present multiplier to perform 8×8 multiply operations without the geometric expansion of AND gates and used in the example block diagram of FIG. 6. The 8 bit A value [a7 . . . a0] is separated into two 4 bit values, A1 and A0, and similarly the 8 bit B value [b7 . . . b0] is separated into two four bit B1 and B0 values and applied to the respective FIG. 6 4×4 sub-multiplier blocks 612, 614, 616, 618 which then generate a binary output from each sub-multiplier, which may comprise a four bit unit element such as 401 coupled to a charge summing unit 412 and ADC 414 generating each sub-multiplier digital output. This separation then provides that the multiplication operation may be performed as four bit multiplies using the sub-product 4-bit multipliers 401, 412, and 414 of FIG. 4A in the 4×4 sub-multiplier blocks 612, 614, 616, 618 of FIG. 6, with each digital output sub-result from sub-multipliers 612, 614, 616, and 618 bit shifted according to order (which accomplishes multiplication by 2 for each shift) by shift blocks 602, 604, and 606, and summing of the result which is output at 610 as a complete digital result. The number of bits assigned to each sub-multiplier 612, 614, 616, or 618 by an input splitter separating those bits to each sub-multiplier may be any number of bits, preferably in the range of three to five bits.

FIG. 7A shows a differential unit element 700 for multiplication of [a2 . . . a0] with [b2 . . . b0]. The differential unit element has several advantages over the single ended unit elements 200 and 401. A differential unit element provides greater isolation from disturbances from the supply voltage, as it tends to be self-cancelling as present on both inputs of the combining ADC, whereas the same voltage disturbance in a single ended UE 200 and 401 propagates through to the ADC input. Additionally, the differential UE provides a factor of 2 greater signal swing for a given UE, providing greater noise immunity and improved signal to noise ratio. Further, Machine Learning (ML) algorithms which make use of the rectified linear unit (ReLU) function require operation with negative coefficients. An additional advantage of a differential UE is the ability to enable separately the positive and negative parts of the unit element to support ReLU signed weighting coefficients for the B input.

FIG. 7A shows a first example of a differential unit element which does not support negative (signed) coefficients. A plurality of positive AND-groups 203aP, 203bP, and 203cP comprising AND gates and charge transfer capacitors with the suffix P is generating positive (P) charge displacements to positive analog charge bus 706P, and a companion plurality of negative AND-groups 203aN, 203bN, and 203cN comprising AND gates and transfer capacitors with the suffix N is generating negative (N) charge displacement to respective analog charge busses 706N. Positive analog charge bus 706P is functionally equivalent to 210 of FIG. 3B, with the respective elements carrying the P suffix. Similarly, the negative analog charge bus 706N is coupled to respective analog charge lines 210aN to 210eN. A plurality of differential unit elements 700 may be cascaded, sharing positive charge buss 706P and 706N, with the charges summing with the binary weighted charge summing unit 212P and 212N, which sum charges into differential ADC 702 and forming the dot product output 704, as before. The individual charge summing capacitors of 212P and 212N are weighted as was described for FIG. 3B, and can incorporate gain balancing capacitors in the summing capacitors as previously described for FIG. 2B or with gain balancing capacitors as described in FIG. 2A. The illustration of FIG. 7A using the structures of FIG. 3B are shown as a simple example, however it is understood that FIG. 3A, 4A, or 4B could be similarly expanded into differential unit element configurations.

Figure 7C:
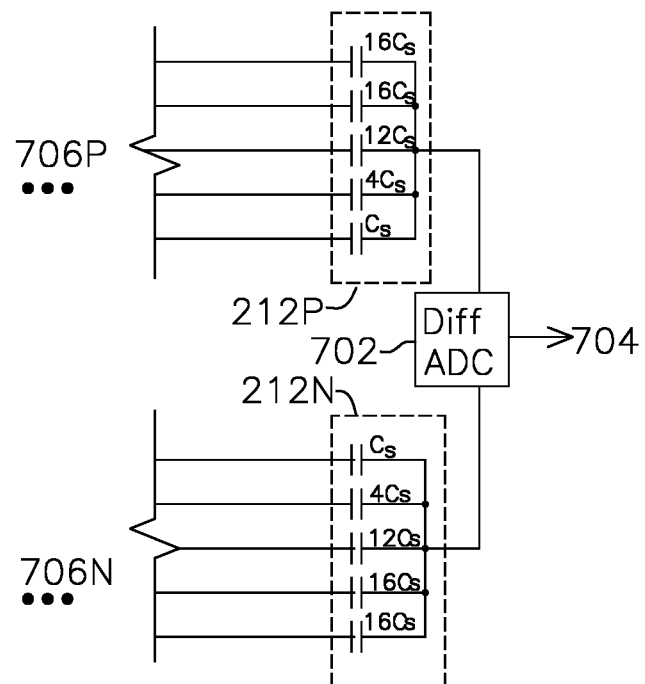
FIG. 7C shows a schematic diagram for a differential charge summing unit with binary weighting.

In another example of the invention supporting the ReLU function with signed weighting coefficients, the A input (such as a[2:0]) is always a positive quantity, and does not have a sign bit, and the weighting function W (such as b[2:0] may include a sign bit Bsgn. It was previously seen from FIG. 4A that the UE complexity increases with additional multiplication bits. An available simplification which allows for additional resolution is where the generally static weight terms W are provided as B coefficients comprising three bits of coefficient value b[2:0] and a sign bit Bsgn, and the A coefficients have three bits of value a[2:0] which are unsigned positive values. In a second example of a differential UE shown in FIG. 7B, unit element 700B is operative with signed B weight coefficients which use the Bsgn bit 710 to alternately enable the positive unit element (P suffix) or enable the negative unit element (N suffix) of FIG. 7B. In this embodiment, unit element 700B has a positive unit element part comprising a plurality of positive AND-groups 203aP, 203bP, 203cP, each positive AND-group having AND gates 202aP, 202bP, 202cP with charge coupling capacitors 208aP, 208bP, 208cP, respectively, coupled to positive analog charges lines 706P. Unit element 700B also has a negative unit element part comprising a plurality of negative AND-groups 203aN, 203bN, 203cN, each negative AND-group having AND gates 202aN, 202bN, 202cN with charge coupling capacitors 208aN, 208bN, 208cN, respectively, coupled to negative analog charges lines 706N. In the embodiment of FIG. 7B, a positive sign bit Bsgn 710 associated with the weight coefficients b[2:0] is applied to enable the upper P-suffixed AND-groups 203aP, 203bP, and 203cP to enable charge transfers to the P suffixed charge transfer bus 210[a-e]P. A negative sign bit Bsgn 710 results in the assertion of/Sign 714, which enables the lower N suffixed AND-groups 203aN, 203bN, and 203cN, with the positive and negative multiplication results being transferred to differential ADC 702 of FIG. 7C, as was described for FIG. 7A. An additional advantage of the architecture of FIG. 7B over the single ended UE of FIGS. 2 and 4 is that a single CLR 711 input can be asserted to return all of the capacitors to an initial state. The AND-group functions are shown as all NAND in FIG. 7B compared with the mixture of AND and NAND in FIG. 7A for understanding the invention, the inversion sense from the AND/NAND gate outputs can be done by appropriate selection of the inversion/non-inversion for each P and N input to the ADC 702 of FIG. 7C.

In many deep learning applications, a Rectified Linear Unit (ReLU) function may be used, which provides functionality similar to a diode. In the present dot product architecture, the ReLU function may be implemented using the SGN bit to disable multiplication for negative coefficients in addition to having the ADC output 0, thereby saving power in both stages.

Additionally, it may be desired to provide a bias term as an offset input to the analog charge bus 210/420. FIG. 8A shows an example charge bias circuit attached to an example analog charge bus 210 or 420, where the capacitors 806 are weighed to provide binary power of 2 weight from the bias input bits of 802 to the charge transferred to the associated line of the analog charge bus 210/420. In this manner, a binary bias value Bbias expressed as a binary input [E8 . . . E0] may be applied at input 802 which is transferred through drivers 804 and through charge transfer capacitors 806 to transfer charge to the analog charge bus 420. The number of bits of the bias input 802 may be provided as any number of bits which are equal to or less than the number of bits in the analog charge bus 210 or 420.

It may also be desired to reset the charge transfer capacitors 208 of FIG. 2 and charge summing unit 212/412 capacitor charges to 0 to initialize the circuit, or to clear previous accumulated values or stored results. FIG. 8B shows an example charge state reset, whereby at least one of the [a3 . . . a0] or [b3 . . . 0] inputs is set to 0 so that the AND gate 408a, 408b, 408c all generate a zero output, and then reset circuit 820 with input 822 shorts the input lines and output line of the charge storage 412 to ground, so that all capacitors are initialized to a 0V state. Other methods for performing charge reset or initialization may be provided, these are given only as examples for understanding the invention and its capabilities.

An important consideration for accuracy of the analog multiplication result is accurate charge transfer weights, which relates to the ratio of charge transfer capacitor 208 value Cu of 410 or 208 to the value of capacitance Cs, where each value of summing capacitor of charge summing unit 212 is binary weighted as previously described. Accordingly, the charge which is transferred from the unit elements 203 via all of the individual charge transfer capacitors 208/410 should be large compared to nominal value Cs of binary weighted charge summing unit 212/412 to avoid systematic errors. Specifically, the total value Cu contributed by all charge transfer capacitors for a particular analog charge bus line 210 (such as those associated with unit element 401 of FIG. 4B) coupled to a line of the analog charge bus 210 or 420 is on the order of 8× or more greater than the largest summing capacitor such as 16 Cs of 212 in FIG. 2B, 64 Cs of 412 in FIG. 4A or 4B, or 16 C of 212P and 212N of FIG. 7.

FIG. 9 shows another example of the invention 900 for performing gain balancing and accumulation of charge across an expandable plurality of unit element (UE) 910a, 910b, 910c . . . etc, where each UE 910 includes three AND-groups 201a, 201b, 201c for each UE, and each AND gate of each AND-group such as 202a, 202b, 202c; 204a, 204b, 204c; 206a, 206b, 206c is coupled to a respective charge transfer capacitor group comprising 208a, 208b, and 208c, respectively. Each charge transfer capacitor of 208a, 208b, and 208c is coupled to a separate charge transfer line 908a, 908b, 908c, 908d, 908e, 908f, 908g, 908h, and 908i, as shown, which are common across the other UE 901b, 901c, etc (not shown). A computation for large number N of UE (specifically N=766) results in charge summing unit 912 having corresponding capacitance weights 8 Cs, 16 Cs, 33 Cs, 16 Cs, 33 Cs, 69 Cs, 33 Cs, 69 Cs, and 152 Cs, each charge summing capacitor having a first terminal coupled to a respective charge transfer line 908a, 908b, 908c, 908d, 908e, 908f, 908g, 908h, and 908i, respectively. The second terminals of the charge summing capacitors of 912 are connected together and applied to the Analog to Digital Converter ADC 214 which provides an accumulated product output A1*B1+A2*B2+A3+B3+ . . . , as before. The advantage of the individual charge line connection is that the resulting chip layout provides a highly symmetrical layout geometry, minimizing parasitic capacitances compared to the alternative embodiment described in FIG. 2A or 2B. For the configuration of FIG. 9, each summing capacitor can be determined from the formula:

$$C[1] = \frac{Ccombiner[1]}{C_u}$$

$$\text{and } C[k] = \frac{N*2^{k-1}C[1]}{N-(2^{k-1}-1)C[1]}$$

where:

Cu is the value of each charge transfer capacitor of 208a, 208b, 208c;

C[1] is the value of the charge summing capacitor of 912 coupled to charge transfer line 908a;

C[k] is the value of each higher order charge summing capacitor of 912.

k=1 corresponds to the value of the summing capacitor associated with the lowest order charge transfer line 908a, with k incrementing for each charge transfer line 908b . . . 908i.

As an example, C[1] is selected to be 8× the value of Cu. In general, C[1] should be larger than the total capacitance attributable to Cu associated with the bit order 0 charge transfer line such as by a factor of 8 or more to minimize summing errors, and the values of 912 are for N=766 (number of UEs sharing an analog charge bus.

FIG. 9 shows nine charge transfer lines for clarity in understanding the invention, and the example does not limit the general scope of the invention to the number of charge transfer lines, size of unit element 910, or number of Unit Elements 901a, 901b, 901n.

The present multiplier architectures have certain advantages. In the prior art, multi-stage multipliers are synchronous devices with a running clock, which requires energy for displacement currents associated with each clock edge transition. In the various examples of the invention, the multiplication is operative asynchronously, and without any clocks, the multiplication value changing and being updated asynchronously when a multiplicand input changes value. Additionally, the present invention has the advantage of scalability, in that additional unit elements 200, 401, or 901 may be chained together on a common charge transfer but leading to a charge summing unit as shown in the figures, such that each additional unit element may be flexibly added or isolated from the analog charge bus, and the accumulation of each multiplication result occurs on a respective analog charge bus 210, 420 908. In an example use case, the invention may be used where the B multiplicands are static weight coefficients and the A multiplicands are dynamic for dot product computations in artificial intelligence applications.

The proceeding has been a description of the various embodiments of the invention. It will be appreciated that deviations and modifications can be made without departing from the scope of the invention, which is defined by appended claims. For example, the present invention is described in terms of AND-groups using AND gates for understanding the invention in terms of additive charge transfers for 0 to 1 output transitions, however it is understood by one skilled in the art that NAND gates may be used throughout all of the AND-groups, as NAND gates have the advantage of requiring fewer transistors per gate for realization. In this case, the charge transfer from 1 to 0 for the same transition in a NAND-group would be subtractive, and can be accounted for by inversion of the summed result. Various approximations may be used in the specification of the patent application, the approximations are understood to refer to ranges from a nominal value. A value which is "substantially" a nominal value is understood to be in the range of a factor of ½ to 2 times the nominal value. A value which is "on the order of" a nominal value or "an order of magnitude" of a nominal value is understood to be in the range 1/10th to 10× the nominal value.

We claim:

1. A multi-stage multiplier operative to multiply a digital A input and a digital B input, each A input and B input having n input bits, the multi-stage multiplier comprising:
    an input splitter subdividing the n A input bits and B input bits into at least two groups of subdivided bits, each group of subdivided bits having fewer than n bits and coupled to a respective sub-product multiplier generating a digital sub-product value, each sub-product multiplier comprising:
        a plurality of unit elements, each said unit element comprising a plurality of AND-groups, each plurality of AND-groups comprising AND gates, each AND gate having one input coupled to a unique one of the subdivided A bits of a respective group and the other AND gate inputs commonly coupled to one of the B bits of the respective group, the output of each AND gate of each AND-group coupled to a particular analog charge line through a charge transfer capacitor of value C, each analog charge line coupled to a first terminal of a respective summing capacitor having a value which as a capacitance value $Cs2^n$ where n is a bit weighted order of the respective analog charge line and Cs is a value smaller than C, each summing capacitor having a second terminal which is coupled together with other summing capacitor second terminals and also coupled to an input of an analog to digital converter (ADC) generating a digital value as the output of the sub-multiplier;
    each sub-multiplier output coupled to a binary shifter according to an order of the bits of the sub-multiplier;
    each binary shifter outputs summed together to form an output.

2. The multi-stage multiplier of claim 1 where the AND-groups comprise three or four AND gates.

3. The multi-stage multiplier of claim 1 where n is at least 4.

4. The multi-stage multiplier of claim 1 where each sub-multiplier has a plurality of unit elements which accept unique A and B inputs, the plurality of unit elements of a sub-multiplier sharing a common set of analog charge lines.

5. The multi-stage multiplier of claim 1 where gain balancing capacitors are placed on each analog charge line to equalize a capacitance of each analog charge line.

6. The multi-stage multiplier of claim 1 where the gain balancing capacitors have a first terminal coupled to a respective analog charge line and a second terminal coupled to at least one of ground or incorporated into an associated charge summing capacitor.

7. The multi-stage multiplier of claim 1 where at least one sub-multiplier comprises:
    at least one unit element comprising a plurality of AND-groups equal to a number of sub-value bits, each AND group comprising a plurality of AND gates equal to the number of sub-value bits, each AND gate having one input coupled to a unique one of the sub-value A bits and the other input coupled to a common one of the sub-value B bits;
    each AND gate having an output coupled to an analog charge line through a charge transfer capacitor;
    each analog charge line coupled to a first terminal of a respective charge scaling capacitor of a charge summing unit;
    each charge scaling capacitor having a second terminal connected to the input of an analog to digital converter;
    the output of the analog to digital converter forming an output of the sub-multiplier.

8. The multi-stage multiplier of claim 7 where the charge transfer capacitors have the same capacitance value.

9. The multi-stage multiplier of claim 1 where the A input and B input are 8 bits and the number of sub-multipliers is four.

10. The multi-stage multiplier of claim 1 where at least one sub-multiplier is operative to multiply [a7 . . . a4] with [b7 . . . b4] and at least one sub-multiplier is operative to multiply [a3 . . . a0] with [b7 . . . b4].

11. The multi-stage multiplier of claim 7 where the at least one unit element comprises a plurality of unit elements operative on corresponding bits of different A input values.

12. A multi-stage multiplier operative to multiply an n bit A value with an n bit B value, the multi-stage multiplier comprising:
    an input splitter separating the A value and B value into a plurality of pairs of sub-values;
    each pair of sub-values applied to a respective sub-multipliers operative to form a digital product value;
    at least one sub-multiplier comprising:
        an analog charge bus;
        at least one unit element coupled to the analog charge bus, the at least one unit element comprising a plurality of AND-groups equal in number to a number of bits of a sub-value, each AND-group comprising a plurality of AND gates equal in number to the number of bits of a sub-value, the plurality of AND gates in each AND-group receiving each of the A sub-value bits and a unique one of the B sub-value bits, each AND gate coupled to an analog charge bus according to a binary order;
        the analog charge bus coupled to a binary weighted charge summing unit comprising binary weighted capacitors, each binary weighted capacitor having one terminal connected to a unique one of the analog charge bus lines and the other terminal commonly connected to the input of an analog to digital converter (ADC), the ADC generating a digital product value;
    each digital product value of each respective sub-multiplier applied to a shifter and shifted according to a sub-value of the A value and B value;
    the outputs of the shifters summed to form a product.

13. The multi-stage multiplier of claim 12 where n is greater than 4.

14. The multi-stage multiplier of claim 12 where at least one shifter performs a left bit shift that is a factor of 2 greater than a left bit shift of a different shifter.

15. The multi-stage multiplier of claim 12 where at least one sub-value has three or four input bits.

16. The multi-stage multiplier of claim 12 where a particular sub-value is applied to two or more sub-multipliers.

17. The multi-stage multiplier of claim 12 where at least one sub-multiplier comprises:
    a plurality of AND gates equal in number to the number of sub-value bits, each AND gate having one input coupled to a unique one of the sub-value A bits and the other input coupled to a common one of the sub-value B bits;

each AND gate having an output coupled to a unique analog charge line through a charge transfer capacitor;

each analog charge line coupled to a first terminal of a respective charge scaling capacitor of a charge summing block;

each charge scaling capacitor having a second terminal connected to the input of an analog to digital converter;

the output of the analog to digital converter forming the output of the sub-multiplier.

18. The multi-stage multiplier of claim 17 where the charge transfer capacitors have the same capacitance value.

19. The multi-stage multiplier of claim 17 where the total capacitance of charge transfer capacitors on a single analog charge line has a value at least eight times larger than a value of a smallest charge scaling capacitor.

20. The multi-stage multiplier of claim 17 where at least one analog charge line includes a gain balancing capacitor to match the capacitance of charge transfer capacitors present on other analog charge lines.

* * * * *